United States Patent
Sofia et al.

(10) Patent No.: US 10,587,284 B2
(45) Date of Patent: Mar. 10, 2020

(54) MULTI-MODE COMPRESSION ACCELERATION

(71) Applicant: INTERNATIONAL BUSINESS MACHINES CORPORATION, Armonk, NY (US)

(72) Inventors: Anthony T. Sofia, Hopewell-Junction, NY (US); Matthias Klein, Wappingers Falls, NY (US); Jonathan D. Bradbury, Poughkeepsie, NY (US); Peter Sutton, Lagrageville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/948,678

(22) Filed: Apr. 9, 2018

(65) Prior Publication Data
US 2019/0312587 A1   Oct. 10, 2019

(51) Int. Cl.
H03M 7/34 (2006.01)
H03M 7/30 (2006.01)
G06F 9/38 (2018.01)
G06F 15/173 (2006.01)

(52) U.S. Cl.
CPC ........ H03M 7/3086 (2013.01); G06F 9/3877 (2013.01); G06F 15/17325 (2013.01)

(58) Field of Classification Search
CPC .... H03M 7/3086; H03M 7/3088; H03M 7/40; H03M 7/30; H03M 7/3079; H03M 7/6088; G06F 12/08; G06F 2212/401
USPC .................................................... 341/51, 107
See application file for complete search history.

(56) References Cited

U.S. PATENT DOCUMENTS

| | | | | |
|---|---|---|---|---|
| 6,092,701 A | * | 7/2000 | Waltenspuhl | B22D 41/34 222/600 |
| 6,449,689 B1 | | 9/2002 | Corcoran et al. | |
| 6,661,839 B1 | * | 12/2003 | Ishida | G01R 31/31921 341/51 |
| 7,376,772 B2 | * | 5/2008 | Fallon | G06F 3/0613 710/62 |
| 7,624,394 B1 | | 11/2009 | Christopher, Jr. | |
| 7,640,381 B1 | | 12/2009 | Zhang et al. | |

(Continued)

FOREIGN PATENT DOCUMENTS

EP    2246786 A1    11/2010

OTHER PUBLICATIONS

Augonnet et al., "Data-Aware Task Scheduling on Multi-Accelerator Based Platforms," 2010 IEEE 16th International Conference on Parallel and Distributed Systems, pp. 291-298.

(Continued)

Primary Examiner — Linh V Nguyen
(74) Attorney, Agent, or Firm — Cantor Colburn LLP; William Kinnaman

(57) ABSTRACT

A computer system includes a plurality of hardware processors, and a hardware accelerator. A first processor among the plurality of processor runs an application that issues a data compression request to compress or decompress a data stream. The hardware accelerator selectively operates in different modes to compresses or decompresses the data stream. Based on a selected mode, the hardware accelerator can utilize a different number of processors among the plurality of hardware to compress or decompress the data stream.

20 Claims, 6 Drawing Sheets

(56) References Cited

U.S. PATENT DOCUMENTS

| | | | |
|---|---|---|---|
| 7,765,521 | B2 | 7/2010 | Bryant |
| 7,890,727 | B2 | 2/2011 | Mathews et al. |
| 8,108,353 | B2 | 1/2012 | Balachandran et al. |
| 8,250,578 | B2* | 8/2012 | Krishnamurthy ..... G06F 9/3877 710/3 |
| 8,275,909 | B1* | 9/2012 | Rothstein ................ H03M 7/30 375/240 |
| 8,312,210 | B2 | 11/2012 | Benhase et al. |
| 8,359,186 | B2 | 1/2013 | Sanesan et al. |
| 8,553,759 | B2* | 10/2013 | Fallon ..................... H03M 7/30 375/240 |
| 8,610,604 | B2 | 12/2013 | Glass et al. |
| 8,712,978 | B1 | 4/2014 | Shilane et al. |
| 8,943,024 | B1 | 1/2015 | Gardner et al. |
| 9,385,749 | B1 | 7/2016 | Nam et al. |
| 9,442,754 | B1 | 9/2016 | Tsirkin |
| 9,514,146 | B1 | 12/2016 | Wallace et al. |
| 9,621,186 | B2 | 4/2017 | Nam et al. |
| 9,716,754 | B2 | 7/2017 | Swift |
| 9,733,854 | B2 | 8/2017 | Sharma et al. |
| 9,811,319 | B2 | 11/2017 | Weinsberg et al. |
| 9,929,748 | B1 | 3/2018 | Gopal et al. |
| 10,019,457 | B1* | 7/2018 | Stefani ................ H03M 7/3059 |
| 10,374,629 | B1 | 8/2019 | Bradbury et al. |
| 2002/0101367 | A1* | 8/2002 | Geiger .................... H03M 7/30 341/51 |
| 2006/0212462 | A1 | 9/2006 | Heller et al. |
| 2009/0307711 | A1 | 12/2009 | Krishnamurthy et al. |
| 2010/0321218 | A1 | 12/2010 | Koratagere |
| 2011/0138270 | A1* | 6/2011 | Li et al. .............. G06F 17/2247 715/242 |
| 2011/0307907 | A1 | 12/2011 | Hwang et al. |
| 2013/0135122 | A1 | 5/2013 | Glass et al. |
| 2013/0135123 | A1 | 5/2013 | Golander et al. |
| 2013/0159811 | A1* | 6/2013 | Biran ..................... H03M 7/30 714/758 |
| 2013/0268497 | A1 | 10/2013 | Baldwin et al. |
| 2013/0307709 | A1 | 11/2013 | Miller et al. |
| 2014/0086309 | A1 | 3/2014 | Beer-Gingold et al. |
| 2014/0351229 | A1* | 11/2014 | Gupta ................. H03M 7/6088 707/693 |
| 2014/0351811 | A1 | 11/2014 | Kruglick |
| 2014/0359219 | A1* | 12/2014 | Evans ................ G06F 12/0802 711/118 |
| 2015/0066878 | A1 | 3/2015 | Agarwal et al. |
| 2016/0173123 | A1* | 6/2016 | Gopal ..................... H03M 7/40 341/65 |
| 2017/0132241 | A1 | 5/2017 | Haverkamp et al. |
| 2017/0187388 | A1 | 6/2017 | Satpathy et al. |
| 2017/0212487 | A1 | 7/2017 | Gupta et al. |
| 2017/0220404 | A1 | 8/2017 | Polar Seminario |
| 2019/0190538 | A1* | 6/2019 | Park ........................ H03M 7/70 |

OTHER PUBLICATIONS

Meng et al., "Investigating applications portability with the Uintah DAG-based runtime system on PetaScale supercomputers," SC '13 Proceedings of the International Conference on High Performance Computing, Networking, Storage and Analysis, Article No. 96.

Planas et al., "AMA: Asynchronous management of accelerators for task-based programming models," Procedia Computer Science 51 (2015): 130-139.

Teimouri et al., "Revisiting accelerator-rich CMPs: challenges and solutions," DAC '15 Proceedings of the 52nd Annual Design Automation Conference, Article No. 84.

Campoalegre, Volumetric Medical Images Visualization on Mobile Devices. MS thesis. Universitat Politècnica de Catalunya, 2010.

D. Syrivelis et al., "On emulating hardware/software co-designed control algorithms for packet switches," SIMUTools '14: Proceedings of the 7th International ICST Conference on Simulation Tools and Techniques, pp. 132-141.

E. Horta et al., "Dynamic hardware plugins in an FPGA with partial run-time reconfiguration," DAC '02 Proceedings pf the 39th annual Design Automation Conference, pp. 343-348.

J. Rapp et al., "Dynamically Configured Hardware Accelerator Functions," ip.com Disclosure No. IPCOM000171311D.

Kachouri et al., "Hardware design to accelerate PNG encoder for binary mask compression on FPGA." SPIE 9400, Real-Time Image and Video Processing. 2015.

Lettieri et al., "Data Compression in the V. 42bis Modems." Wescon/94. Idea/Microelectronics. Conference Record. IEEE, 1994. pp. 398-403.

Mauve, "Protocol enhancement and compression for x-based application sharing." University of Mannheim (1997): 11-12.

Nikkanen, . "uClinux as an embedded solution." Diss, Turku, Salo, Finland (2003).

S. Chai et al., "Reconfigurable Streaming Architectures for Embedded Smart Cameras," ip.com Disclosure No. IPCOM000141061D.

Schroeter et al., "Dynamic configuration management of cloud-based applications," SPLC'12 Proceedings of the 16th International Software Product Line Conference—vol. 2, pp. 171-178.

Singh et al., "Enhancing LZW Algorithm to Increase Overall Performance." India Conference, 2006 Annual IEEE. IEEE, 2006. (4 pages).

Anthony T. Sofia et al., "Computer System Supporting Migration Between Hardware Accelerators Through Software Interfaces", U.S. Appl. No. 15/948,659, filed Apr. 9, 2018.

Anthony T. Sofia, "Computer System Supporting Multiple Encodings With Static Data Support", U.S. Appl. No. 15/938,000, filed Mar. 28, 2018.

Jonathan D. Bradbury et al., "Compression Hardware Including Active Compression Parameters", U.S. Appl. No. 15/972,394, filed May 7, 2018.

List of IBM Patents or Patent Applications Treated as Related; (Appendix P), Filed May 16, 2018; 2 pages.

\* cited by examiner

MULTI-MODE COMPRESSION ACCELERATION

BACKGROUND

The present invention relates to digital computer systems, and more particularly, to digital data compression schemes employed in digital computer systems.

Data compression involves encoding information using fewer bits than the original data stream. Lempel-Ziv (LZ) compression algorithms, for example, achieve compression by replacing repeated occurrences of data with references to a single copy of the data existing earlier in the original data stream. Data accelerators are often implemented in hardware to provide improved compression throughput and/or reduced power consumption. In existing data accelerators, area and logic resource requirements dictate the number of accelerators that may be incorporated onto a single chip.

SUMMARY

According to a non-limiting embodiment, a computer system comprises a plurality of hardware processors, and a hardware accelerator. A first processor among the plurality of processor is configured to run an application that issues a data compression request to compress or decompress a data stream. The hardware accelerator is configured to compress or decompress the data stream, and is configured to selectively operate in a plurality of different compression modes. The hardware accelerator utilizes a different number of processors among the plurality of hardware to compress or decompress the data stream based on a selected compression mode among the plurality of different compression modes.

According to another non-limiting embodiment, a method is provided to control a hardware accelerator installed in a computer system. The method comprises running an application via a first processor included among a plurality of hardware processors, and issuing, via the application, a data compression request to compress or decompress a data stream. The method further comprises selectively operating the accelerator in a plurality of different compression modes to compress or decompress the data stream. The accelerator utilizes a different number of processors among the plurality of hardware to compress or decompress the data stream based on a selected compression mode among the plurality of different compression modes.

According to yet another non-limiting embodiment, a computer program product controls a computer system to perform compression or decompression of data stream. The computer program product comprises a computer readable storage medium having program instructions embodied therewith. The program instructions are executable by an electronic computer processor to control the computer system to perform operations comprising running an application via a first processor included among a plurality of hardware processors, and issuing, via the application, a data compression request to compress or decompress a data stream. The operations further comprise selectively operating the accelerator in a plurality of different compression modes to compress or decompress the data stream. The accelerator utilizes a different number of processors among the plurality of hardware to compress or decompress the data stream based on a selected compression mode among the plurality of different compression modes.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
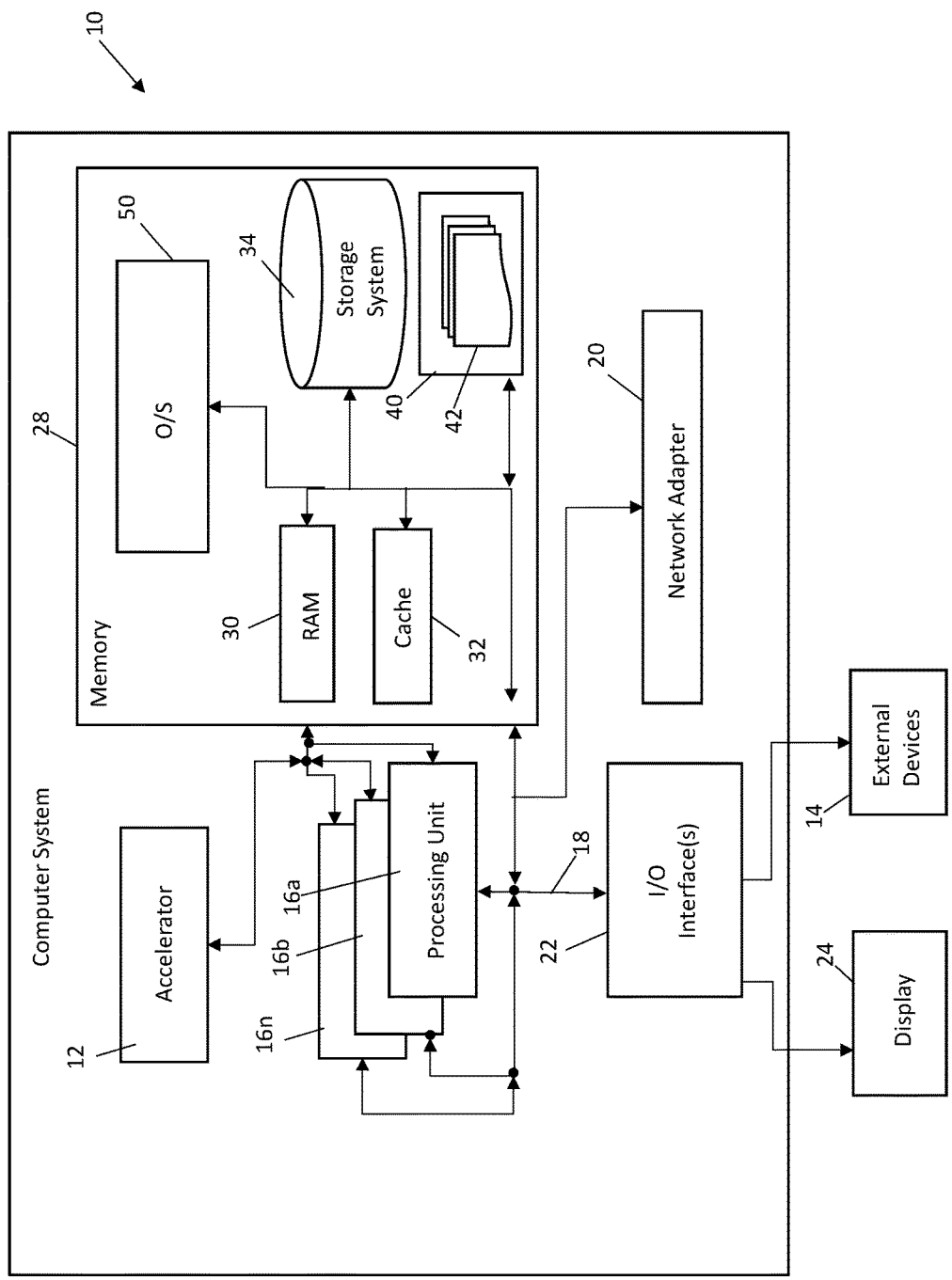
FIG. 1 is a block diagram illustrating a computer system which is capable of compressing data in accordance with various embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the disclosed embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" may be understood to include any integer number greater than or equal to one, i.e., one, two, three, four, etc. The terms "a plurality" may be understood to include any integer number greater than or equal to two, i.e., two, three, four, five, etc. The term "connection" may include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, conventional accelerators operate in a single, synchronous operating mode. This synchronous operating mode runs in-line with the execution of the current program. That is, conventional accelerators run synchronously and utilize the single processor running the application to perform data compression or decompression. However, the synchronous operating mode can suffer from increased workload and memory bottlenecks when performing compression or decompression on data having a high compression ratio. In general, the data compression ratio indicates the reduction in data representation size produced by a given data compression algorithm, and can be defined as the ratio between the uncompressed size and compressed size. Thus, an application requesting data compression having a high compression ratio can increase work load and memory consumption when performing synchronous data compression.

As described herein, one or more embodiments address the above-described shortcomings of the prior art by providing a digital computer system that implements a multi-mode accelerator. The multi-mode accelerator selectively operates in different compression modes such as, for example, a synchronous mode to perform synchronous compression and an asynchronous mode to perform asynchronous compression. When operating in the synchronous compression mode, the accelerator utilizes the same processor which is running the application that issued the compression or decompression request. In one example, the hardware offloads computation-intensive portions of the data compression to the accelerator, while the remainder of the code or non-intensive computations still run on the processor running the application that issued the data compression or decompression request.

When operating in the asynchronous compression mode, however, the several different processors and their corresponding accelerators are utilized to perform compression or decompression of data requested by the running program or application. Unlike the synchronous compression mode, one or more of the processors are located remotely from the processor which is running the application that issued compression or decompression request. In this manner, the total processing work can be offloaded or spread among several different available processors and their corresponding accelerator. Therefore, although latency may increase, less memory space can be consumed while also alleviating pipeline bottlenecks.

With reference now to FIG. 1, a computer system 10 is illustrated in accordance with a non-limiting embodiment of the present disclosure. The computer system 10 may be based on the z/Architecture, for example, offered by International Business Machines Corporation (IBM). The architecture, however, is only one example of the computer system 10 and is not intended to suggest any limitation as to the scope of use or functionality of embodiments described herein. Regardless, computer system 10 is capable of being implemented and/or performing any of the functionality set forth hereinabove.

Computer system 10 is operational with numerous other general purpose or special purpose computing system environments or configurations. Examples of well-known computing systems, environments, and/or configurations that may be suitable for use with computer system 10 include, but are not limited to, personal computer systems, server computer systems, thin clients, thick clients, cellular telephones, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system 10 may be described in the general context of computer system-executable instructions, such as program modules, being executed by the computer system 10. Generally, program modules may include routines, programs, objects, components, logic, data structures, and so on that perform particular tasks or implement particular abstract data types. Computer system 10 may be practiced in distributed cloud computing environments where tasks are performed by remote processing devices that are linked through a communications network. In a distributed computing environment, program modules may be located in both local and remote computer system storage media including memory storage devices.

As shown in FIG. 1, computer system 10 is shown in the form of a general-purpose computing device, also referred to as a processing device. The components of computer system may include, but are not limited to, an accelerator 12, one or more processors or processing units 16a, 16b, 16n, system memory 28, and a bus 18 that couples various system components.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system 10 may include a variety of computer system readable media. Such media may be any available media that is accessible by computer system/server 10, and it includes both volatile and non-volatile media, removable and non-removable media.

System memory 28 can include an operating system (OS) 50, along with computer system readable media in the form of volatile memory, such as random access memory (RAM) 30 and/or cache memory 32. Computer system 10 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the disclosure.

The OS 50 controls the execution of other computer programs and provides scheduling, input-output control, file and data management, memory management, and communication control and related services. The OS 50 can also include a library API (not shown in FIG. 1). The library API is a software library comprising APIs for performing the data manipulation functions provided by the specialized hardware devices such as, for example, the accelerator 12.

The storage system 34 can store a basic input output system (BIOS). The BIOS is a set of essential routines that initialize and test hardware at startup, start execution of the OS 50, and support the transfer of data among the hardware devices. When the computer system 10 is in operation, the processors 16*a*-16*n* are configured to execute instructions stored within the storage system 34, to communicate data to and from the memory 28, and to generally control operations of the computer system 10 pursuant to the instructions.

One or more accelerators 12 are in signal communication with each processor 16*a*-16*n*, along with the system memory 28, and can operate as a hardware data accelerator and/or a hardware data deaccelerator. Although one accelerator 12 is illustrated, it can be appreciated that each processor 16*a*, 16*b*, 16*n*, etc., controls a corresponding individual accelerator 12. In at least one embodiment, there is a one-to-one relationship between the number of processors 16*a*, 16*b*, 16*n*, etc., and the number of accelerators.

Each accelerator 12 can apply various compression algorithms or decompression algorithms, sometimes referred to as hardware compressions or hardware decompressions, to data or data streams requested by an application. Various lossless compression algorithms, for example, can be executed by the accelerator to reduce the size of data or a data stream requested by an application. Although the application is described herein in terms of issuing compression requests, the application is not limited thereto and can apply in a similar manner to decompression requests.

Program/utility 40, having a set (at least one) of program modules 42, may be stored in memory 28 by way of example, and not limitation, as well as the OS 50, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system 10 may also communicate with one or more external devices 14 such as a keyboard, a pointing device, a display 24, etc.; one or more devices that enable a user to interact with computer system/server 10; and/or any devices (e.g., network card, modem, etc.) that enable computer system/server 10 to communicate with one or more other computing devices. Such communication can occur via Input/Output (I/O) interfaces 22. Still yet, computer system 10 can communicate with one or more networks such as a local area network (LAN), a general wide area network (WAN), and/or a public network (e.g., the Internet) via network adapter 20. As depicted, network adapter 20 communicates with the other components of computer system 10 via bus 18. It should be understood that although not shown, other hardware and/or software components could be used in conjunction with computer system 10. Examples include, but are not limited to: microcode, device drivers, redundant processing units, external disk drive arrays, RAID systems, tape drives, data archival storage systems, etc.

Figure 2:
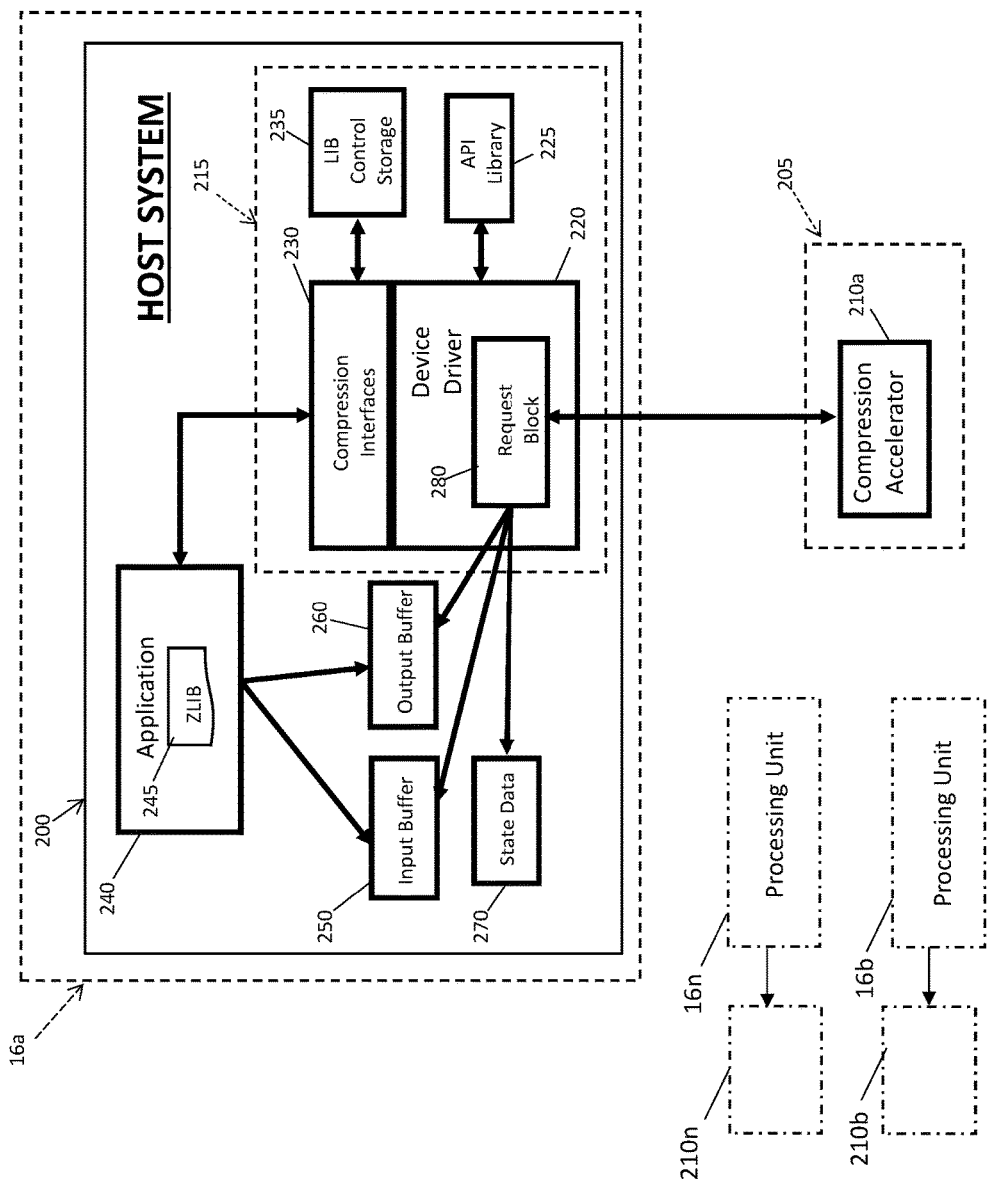
FIG. 2 is a block diagram of a hardware accelerator operating in a synchronous mode according to a non-limiting embodiment.

With reference to FIG. 2, a host system 200 is illustrated in signal communication with one or more computing hardware components 205 according to a non-limiting embodiment. The host system 200 and the hardware component 205 can be implemented using one of the processing units 16*a* in combination with the other components of the computer system 10 described in FIG. 1. One or more additional processing units 16*b*-16*n* are also provided. Each processing unit 16*a*, 16*b*, 16*n* can be prioritized to run the same type of system (e.g., a virtual system), or can be prioritized to run different systems. For example, a first processing unit 16*a* can run input/output servicing, a second processing unit 16*b* can run a first virtual machine, and a third processing unit 16*c* can run a different second virtual machine.

The hardware component 205 includes, but is not limited to, an electronic hardware controller installed with an accelerator 210. According to a non-limiting embodiment, the accelerator 210 can be shared among multiple host systems, but for simplicity only one host system 200 is shown in FIG. 2. The interaction between the accelerator 210 and the host system 200 can be controlled by the host system's operating system (OS) 215.

The host OS 215 includes a device driver 220 capable of providing one or more compression interfaces 230, one or more API libraries 225, and a compression library control storage unit 235. The OS 215 can also provide different compression and decompression functions including, but not limited to, a function to discover if certain compression/decompression services are available, a function to determine if a user of the current task has access to use a given compression/decompression service, and a function to obtain a given compression/decompression service from an external source.

The host system 200 is capable of running one or more applications 240, which may issue requests to compress or decompress data or a targeted data stream. The application 240 is installed with one or more compression libraries 245. A "zlib" is referenced in the figures; however, the disclosure is of course not limited to any particular library. The compression library 245 is compatible with the compression interface 230 of the OS 215 and informs the accelerator 210 (e.g., via one or more parameter data blocks) of the specific encoding scheme to be used to compress or decompress the requested data or data stream.

The compression library 245 can also access the API library 225 and the compression library control storage unit 235. The API library 225 can be accessed to provide the application 240 with an API capable of calling different compression and decompression functions provided by the OS 215.

The compression library control storage unit 235 includes various memory fields that are controlled by the OS 215, but can be accessed by the compression library 245. For instance, various memory fields in the compression library control storage unit 235 may be specifically allocated to the compression library 245 for its access. The compression library 245 has instructions to read the data from these fixed memory fields and operate accordingly.

In one or more embodiments, uncompressed data is obtained by the application 240 and is passed by a pointer to the compression library 245. The compression library 245 passes the pointer to the operating system 215 for the data buffer. In turn, the operating system 215 passes the buffer data indicated by the pointer to the hardware 205, and the accelerator 210 and one or more processing units 16n, 16b, and/or 16a perform an initial data compression on the data provided by the application 240. The initial compressed data can be stored in the output buffer 260, and then passed by a pointer between the OS 215 and the compression library 245. In the event a flush operation is performed, then the compression library 245 possesses information indicating which compressed output buffer of data that it can operate on. The operations of the compression library 245 include performing an additional compression operation such as a "DEFLATE" operation, for example, on the compressed data obtained from the output buffer to generate final compressed data. The "DEFLATE" operation can include injecting control data, such as an EOB symbol, into the EOB of the compressed data obtained from the output buffer.

Various types of compression algorithms can be utilized in the computer system 10 such as, for example, an adaptive lossless data compression (ALDC) family of products which utilize a derivative of Lempel-Ziv encoding to compress data. As a general compression technique, the Lempel-Ziv algorithm integrates well into systems required to handle many different data types. This algorithm processes a sequence of bytes by keeping a recent history of the bytes processed and pointing to matching sequences within the history. Compression is achieved by replacing matching byte sequences with a copy pointer and length code that together are smaller in size than the replaced byte sequence.

The compression algorithm can also include the "DEFLATE" compression format, which uses a combination of the LZ77 algorithm (which removes repetitions from the data) and Huffman coding. The Huffman encoding is entropy encoding that is based on a "Huffman tree". In order to Huffman encode and decode data, a system must know in advance that the Huffman tree is being used. In order to accommodate decompression (e.g., an "Inflate" operation), the Huffman tree is written at the header of every compressed block. In one embodiment, two options are provided for Huffman trees in the Deflate standard. One option is a "static" tree, which is a single hard-coded Huffman tree, known to all compressors and decompressors. The advantage of using this static tree is that its description does not have to be written in the header of a compressed block, and is ready for immediate decompression. On the other hand, "dynamic" trees are tailored for the data block at hand and an exact description of the dynamic tree must, therefore, be written to the output.

Huffman encoding may also use a variable-length code table based on entropy to encode source symbols, and as previously mentioned, is defined either as either static or dynamic. In static Huffman coding, each literal or distance is encoded using a fixed table (SHT) that is defined in the RFC. In dynamic Huffman coding, however, special coding tables (DHT) are constructed to better suit the statistics of the data being compressed. In most cases, using DHT achieves better compression ratio (e.g., quality) when compared to SHT, at the expense of degrading the compression rate (e.g., performance) and adding design complexity. The static and dynamic Huffman encoding methods best reflect the built-in tradeoff between compression rate and ratio. The static Huffman method may achieve a lower compression ratio than is possible. This is due to using a fixed encoding table regardless of the content of the input data block. For example, random data and a four-letter DNA sequence would be encoded using the same Huffman table.

The compression library 245 can be implemented in the application 240 as a software library used for deflation/inflation and can be an abstraction of a compression algorithm. The compression library 245 obtains this compressed data, and further performs a "DEFLATE" operation on the compressed data to generate a final compressed data. The "DEFLATE" operation includes injecting control data, such as an EOB symbol, into the EOB.

In at least one embodiment, the compression library 245 allows the application 240 to break up input data to be deflated/inflated in arbitrary ways across multiple requests and provides arbitrary sized output buffers to hold the results of the deflate/inflate operation. Since the zlib compression algorithm, for example, employs the Lempel-Ziv77 type compression followed by a layer of a Huffman encoding, it achieves an increased compression ratio when the techniques are performed effectively. Even more so, the output adheres to a well-accepted standard (e.g., the DEFLATE compression format). As such, it is supported by a wide variety of web browsers and applications. Several different versions of the compression library 245 can exist and can be included with a given application 240. The compression library 245 can also allow for either the off-the-shelf software compression or decompression, along with providing a second path that can optionally communicate with the OS 215 to perform compression and/or decompression.

To compress the requested data, the application 240 outputs one or more compression requests to the compression interface 230 of the OS 215. On each request, the application 240 can supply an input buffer 250 with the data to be processed and an output buffer 260 where the processed data results are stored. On the first request of a stream, the device driver 220 of the OS 215 receives a data control block from compression library 245 which includes a stream state 270 for the data stream and may exist for the life of the data stream according to an embodiment. For each request, the device driver 220 can generate a request block 280, which can include references to the stream state 270 and the application's input buffer 250 and output buffer 260.

To begin processing the compression request, the accelerator 210 reads the request block 280, and processes the data in the input buffer 250 to generate compressed or and/or decompressed data using an installed compression algorithm. As described herein, various compression algorithms can be employed such as, for example, ALDC algorithms. The resulting compressed data can be saved in the output buffer 260. According to a non-limiting embodiment, the accelerator 210 can also save an updated stream state 270 when directed by the device driver 220. Although data compression is described herein, embodiments described herein can also be applied to data decompression scenarios.

In one or more embodiments of the invention, the accelerator 210 selectively operates in multiple different modes. For example, the accelerator 210 can selectively operate in a synchronous compression mode or an asynchronous compression mode. When operating in the synchronous mode (see FIG. 2), the accelerator 210 utilizes the same processor (e.g. 16a) of which is running the application 240 that issued the compression request. Accordingly, the compression or decompression is performed in-line with the application 240 which issued the data compression/decompression request.

Figure 3A:
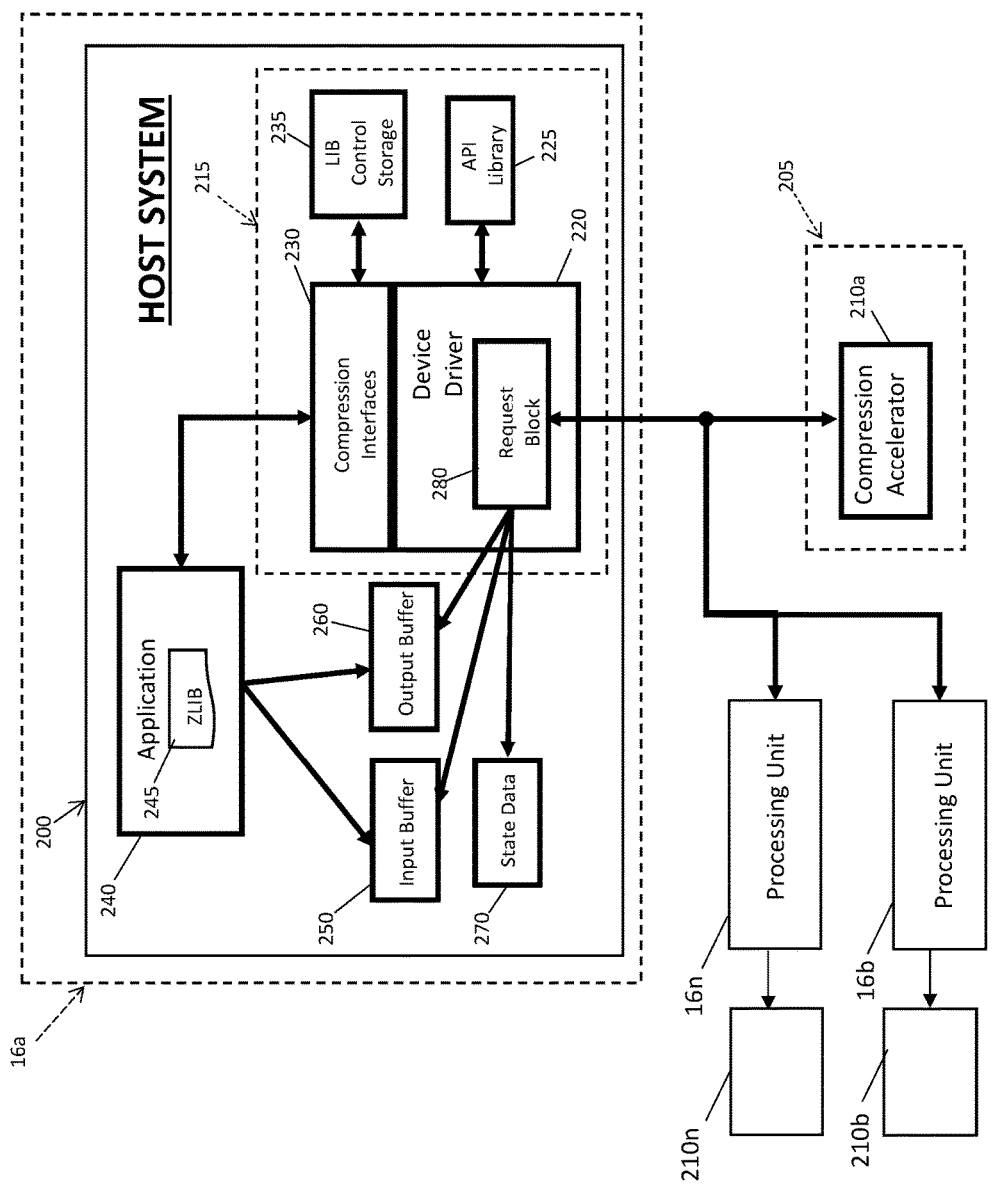
FIG. 3A is a block diagram of a hardware accelerator operating in an asynchronous mode according to a non-limiting embodiment.
Figure 3B:
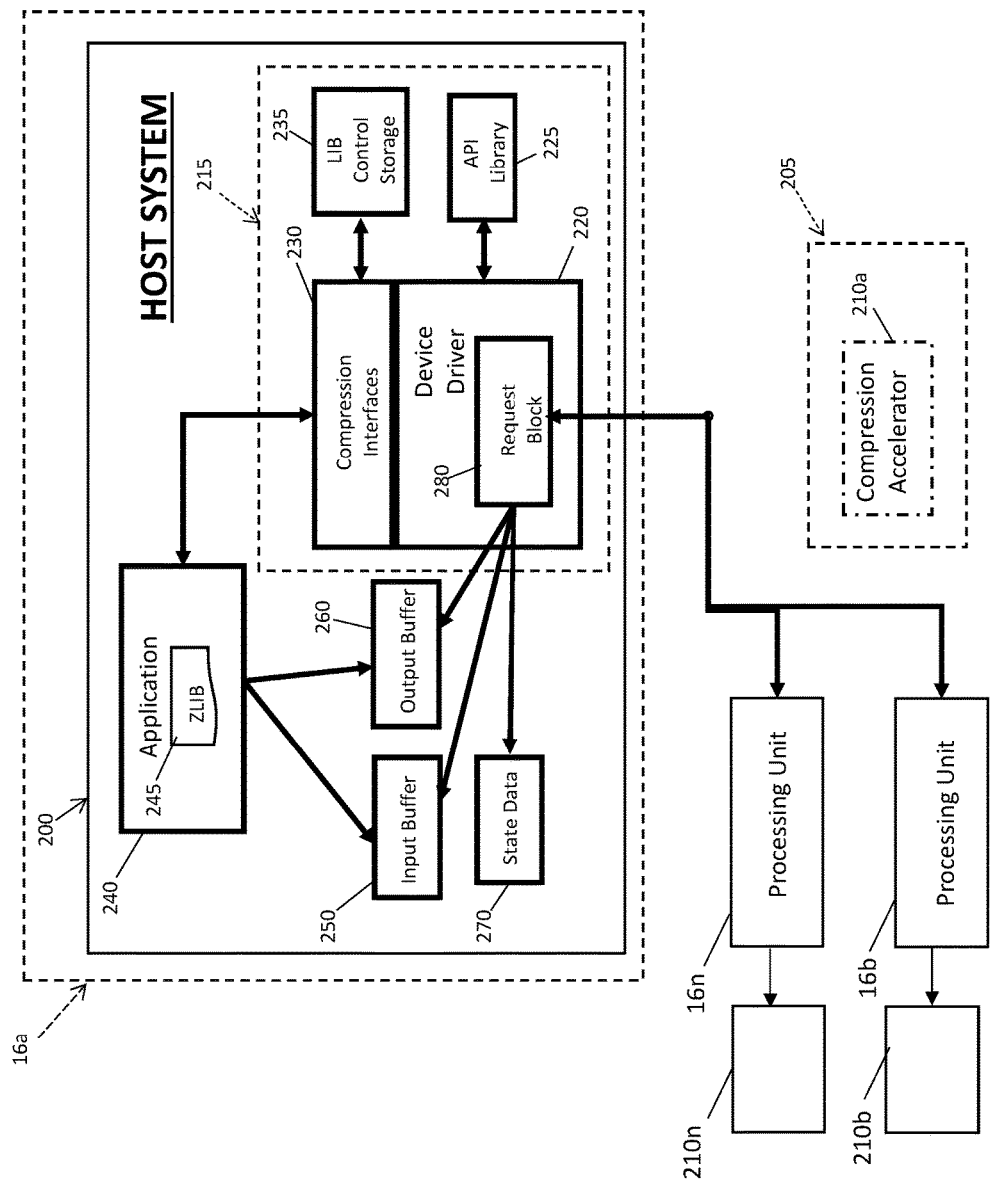
FIG. 3B is a block diagram of a hardware accelerator operating in an asynchronous mode according to another non-limiting embodiment.

When operating in the asynchronous compression mode, several different processors 16a, 16b, 16n and their corresponding accelerators 210a, 210b, 210n are utilized to perform compression of data requested by an application 240. In at least one embodiment, one or more of the processors (e.g., 16b and 16n) utilized during the asynchronous mode are located remotely from the processor (e.g. 16a) which is running the application 240 that issued the compression request. Accordingly, the computer system's remaining processors (e.g., 16b and 16n) and their corresponding accelerators (e.g. 210b and 210n) can be utilized to perform compression or decompression of the requested data. In one example, the remaining processors 16b, 16n and their corresponding accelerators 210b, 210n, respectively, can be utilized along the accelerator (e.g., 210a) corresponding to the processor (e.g., 16a) running the application 240 which issue the compression/decompression requested (see FIG. 3A). In another example, the remaining processors 16b, 16n and their corresponding accelerators 210b, 210n, respectively, can be utilized, while excluding the accelerator (e.g., 210a) corresponding to the processor (e.g., 16a) running the application 240 which issue the compression/decompression requested (see FIG. 3B). In any case, the asynchronous mode allows for the total processing work load to be offloaded or spread among several different available processors (e.g., 16a, 16b and 16n), and thus their corresponding accelerators 210a, 210b and 210n, respectively. Therefore, less of the computer system memory can be consumed, while also alleviating pipeline bottlenecks in the computer system 10.

In one or more embodiments, the application 240, the device driver 220, and/or the accelerator 210 can actively invoke an operating mode among the various operating modes of the accelerator 210, e.g., either the synchronous compression mode or the application 240 can request that the accelerator 210 can command that accelerator 210 to perform the compression/decompression in a mode of its choosing, i.e., either the asynchronous mode (using multiple processor) or the synchronous compression mode (using the single processor running its operation).

In another embodiment, the compression library 245 can add information to the request block 280 indicating the expected compression ratio of the requested data compression. The device driver 220 and/or the accelerator 210 can then determine whether the synchronous compression mode or asynchronous compression mode is best suited to perform the requested data compression or decompression based on a use-case's requirements for latency and scaling or implicitly by the system based on some set of the parameters included in the request block 280.

In another embodiment, the accelerator 210 or the device driver 220 is aware of the current work load of each processor 16a, 16b, 16n included in the system. Accordingly, the accelerator 210 or the device driver 220 can selectively invoke either the synchronous mode or the asynchronous mode based the current work load of each processor 16a, 16b, 16n. In addition, the accelerator 210 or device driver 220 can override a compression mode request from the application 240 based on one or more override conditions. For example, the accelerator 210 can override a compression mode request based on the current work load of the processors 16a, 16b, and 16n. For instance, an application 240 may attempt to command the accelerator 210 to compress a requested data stream according to the asynchronous mode. The accelerator 210, however, may determine only the processor (e.g. 16a) running the application 240 that issued the compression request is available to perform the data compression. Accordingly, the accelerator 210 overrides the application's synchronous compression mode request and instead invokes the asynchronous mode to perform the requested data compression.

The accelerator 210 or device driver 220 can also override compression mode requests based on other criteria such as, for example, latency thresholds, etc. In another embodiment, the accelerator 210 or device driver 220 may determine that a given accelerator mode will maximize system performance (e.g., maximize throughput) compared to a different accelerator mode. In this scenario, the accelerator mode can be automatically invoked or the initial requested accelerator mode can be overridden to provide the most efficient data compression.

Figure 4:
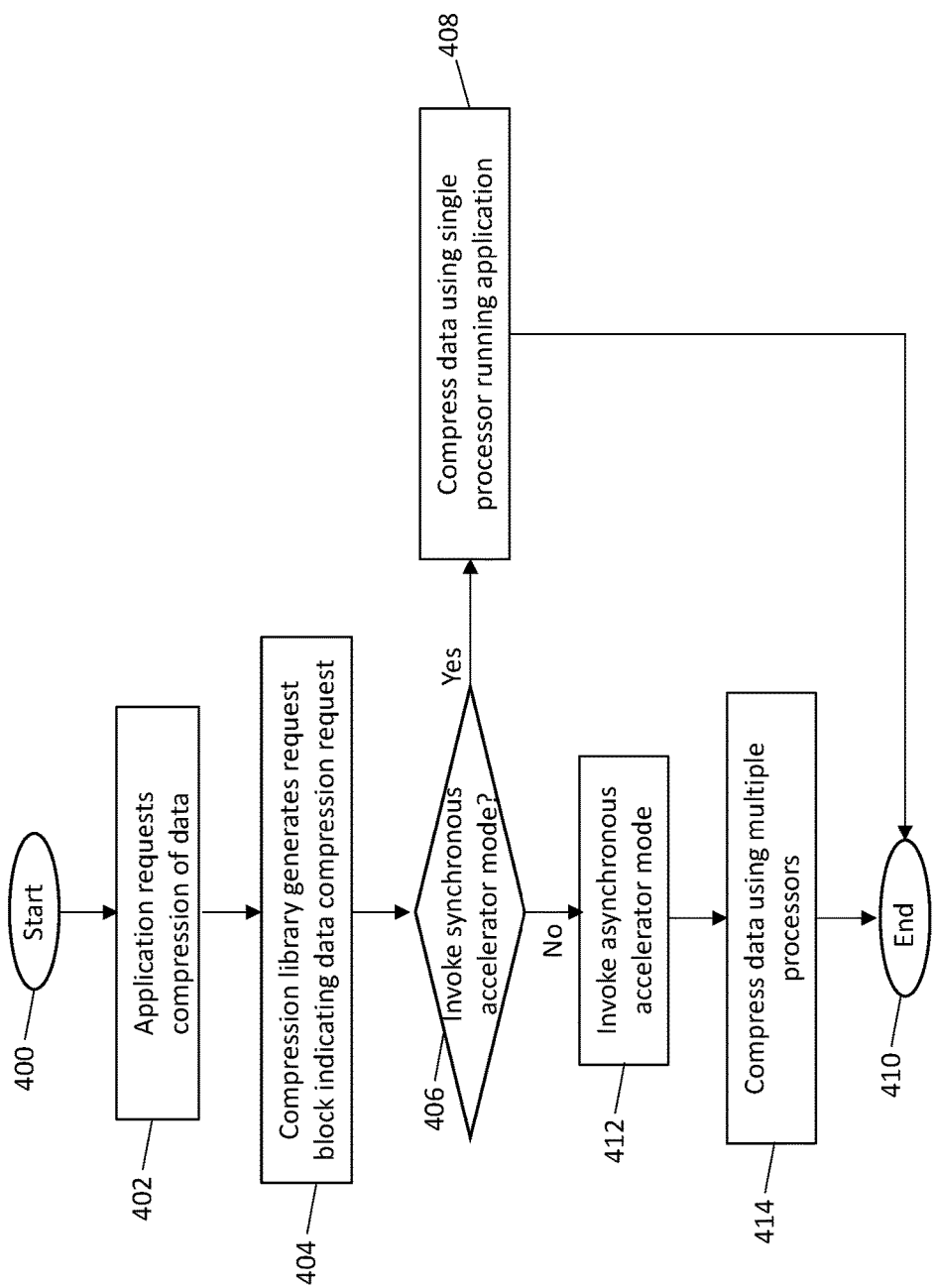
FIG. 4 is a flow diagram illustrating a method of operating a multi-mode accelerator to compress data according to non-limiting embodiment.

With reference now to FIG. 4, a method of operating a multi-mode accelerator to compress data is illustrated according to a non-limiting embodiment. The method begins at operation 400, and at operation 402 an application running on a first processor requests compression of data. At operation 404, the compression library associated with the application generates a request block indicating the data compression request. At operation 406, a determination is made as to whether a synchronous mode of the accelerator or an asynchronous mode of the accelerator is invoked. When the synchronous mode is invoked, the method proceeds to operation 408, and the accelerator compresses the requested data using the single processor running the application which generated the data compression request. After compressing the data, the method ends at operation 410.

When, however, the synchronous mode is not invoked at operation 406, the asynchronous mode of the accelerator is invoked at operation 412. At operation 414, the data is compressed using multiple processors. At least one of the processors utilized to perform the requested data compression is different and remotely located from the processor running the application which generated the data compression request. After compressing the data, the method ends at operation 410.

Figure 5:
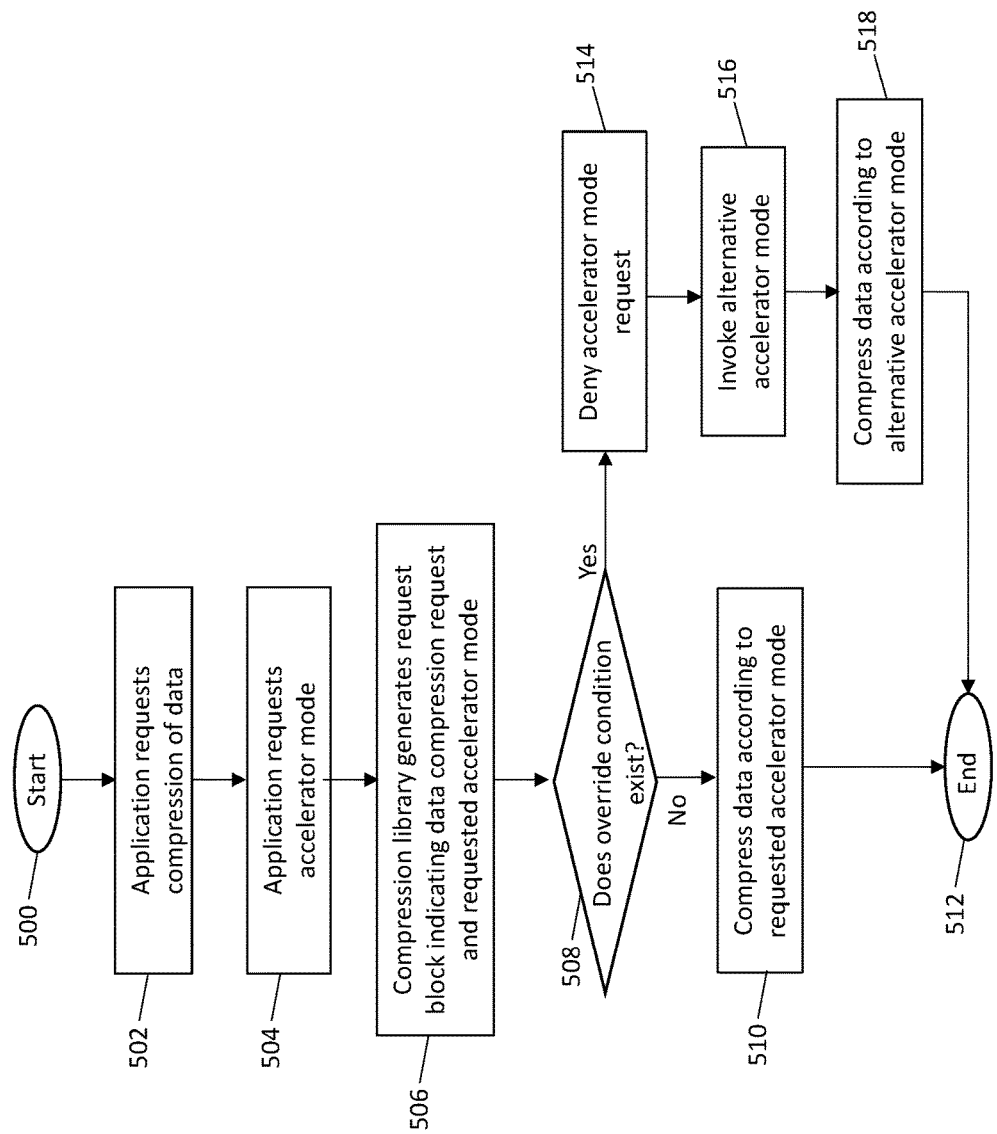
FIG. 5 is flow diagram illustrating a method of compressing data using a multi-mode accelerator according to a non-limiting embodiment.

Referring now to FIG. 5, a method of compressing data using a multi-mode accelerator is illustrated according to a non-limiting embodiment. The method includes, for example, the ability to override accelerator mode requests so that the system can perform data compression in the most efficient and effective manner by taking into account one or more override conditions. The override conditions include, for example, overall system latency requirements, processor availability, and accelerator prioritization.

The method begins at operation 500 and at operation 502, an application requests compression of data. At operation 504, the application requests a specific accelerator mode to perform the data compression. For example, the application may initially request that the data be compressed using the asynchronous mode of the accelerator. At operation 506, the compression library associated with the application generates a request block indicating the data compression request along with the requested accelerator mode (e.g., a request to utilize the asynchronous accelerator mode). At operation 508, a determination is made as to whether an override condition exists. The override condition includes, but is not limited to, availability of other processors included in the system, current workload of the other processors included in the system, latency thresholds, and overall latency requirements of the system. When an override condition does not exist, the method proceeds to operation 510 and the accelerator compresses the data according to the requested accelerator mode (e.g., the asynchronous mode). When the data compression is complete, the method ends at operation 512.

When, however, an override condition exists at operation 508, the initial accelerator mode request (e.g., the request to invoke the asynchronous mode of the accelerator) is denied at operation 514. In one example, the accelerator or the device driver may determine that there are no additional processors available to assist in performing the data compression compress. Accordingly, the request to invoke the asynchronous mode (which utilizes multiple processors in addition to the processor which generated the data request) is denied. At operation 516, an alternative accelerator mode (e.g., the synchronous accelerator mode) is invoked. At operation 518, the accelerator performs the data compression request according to the synchronous mode of the accelerator, and the method ends at operation 512.

As described herein, one or more embodiments provide a digital computer system that implements a multi-mode accelerator. The multi-mode accelerator selectively operates in a synchronous mode to perform synchronous compression and an asynchronous mode to perform asynchronous compression. When operating in the synchronous compression mode, the same processor which is running the application that requested the compression request is utilized to perform the compression or decompression. When operating in the asynchronous compression mode, however, several different processors and their corresponding accelerators are utilized (e.g., operated in parallel) to perform compression of data requested by the running program or application. In this manner, the total processing work can be offloaded or spread among several different available processors and their corresponding accelerators. If override conditions exist (e.g., there are no additional processors to assist in the data compression), a request to invoke a particular mode (e.g., the synchronous mode or the asynchronous mode) can be overridden. Therefore, the system is not forced to perform inefficient data compression.

As described herein, various non-limiting embodiments provide a computer system that initiates different device drivers based on the current version of the hardware (e.g., the hardware accelerator). One or more embodiments also provide an initialization procedure, which loads compression library control data fields of the OS memory with different control data depending on the current version of the accelerator. When the computer system is initialized, the control data and constants stored in the compression memory control memory fields are also updated to correctly identify the values required to operate with a new or updated accelerator. The compression library accesses the memory fields in the OS which store the data control data, and the behavior and operability of the compression library is driven accordingly. In this manner, the static compression library can remain actively compatible with the hardware to perform the proper compression operations linked to the current application despite a change or update in the accelerator.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN)

or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer system comprising:
a plurality of hardware processors, wherein a first processor among the plurality of processor configured to run an application that issues a data compression request to compress or decompress a data stream; and
a hardware accelerator configured to compress or decompress the data stream, and configured to monitor a current workload of each hardware processor among the plurality of processors,
wherein the computer system is configured to selectively operate in a plurality of different compression modes, and
wherein a different number of processors among the plurality of hardware processors are utilized to compress or decompress the data stream based on a selected compression mode among the plurality of different compression modes, and wherein the hardware accelerator invokes the selected compression mode based on the current workload of each hardware processor.

2. The computer system of claim 1, wherein at least one remaining processor among the plurality of processors is utilized to compress or decompress the data stream in response to invoking a first compression mode among the plurality of compression modes.

3. The computer system of claim 2, wherein the at least one remaining processor is in signal communication with a second hardware accelerator, and the at least one remaining processor and second hardware accelerator are located remotely from the first processor and the hardware accelerator.

4. The computer system of claim 3, wherein the at least one remaining processor includes a plurality of remaining processors that operate in parallel with one another, each processor among the plurality of remaining processors in signal communication with a corresponding hardware accelerator.

5. The computer system of claim 2, wherein the accelerator utilizes the first processor while excluding remaining processors among the plurality of processors to compress or decompress the data stream in response to invoking a different second compression mode among the plurality of compression modes.

6. The computer system of claim 5, wherein the data compression request includes compression information indicating an expected compression ratio associated with the data compression request, and wherein the hardware accelerator determines the expected compression ratio prior to compressing or decompressing the data stream, and automatically selects between the first compression mode and the second compression mode based on the expected compression ratio corresponding to the data compression request.

7. The computer system of claim 6, wherein the application issues a compression mode request to invoke a selected compression mode among the plurality of different compression modes.

8. The computer system of claim 7, wherein the accelerator overrides the compression mode request and invokes a second compression mode different from the compression mode indicated by the compression mode request in response to determining a presence of at least one override condition.

9. The computer system of claim 8, wherein the override condition includes at least one of a compression ratio corresponding to the data compression request, a number of the remaining processors available to perform the data compression request, and an overall latency requirement of the computer system.

10. A method of controlling a hardware accelerator installed in a computer system, the method comprising:
running an application via a first processor included among a plurality of hardware processors, each processor in signal communication with a corresponding accelerator;
issuing, via the application, a data compression request to compress or decompress a data stream;
monitoring, via the hardware accelerator, a current workload of each hardware processor among the plurality of processors; and
selectively operating the computer system in a plurality of different compression modes to compress or decompress the data stream,
wherein the computer system invokes a different number of processors among the plurality of hardware based on a selected compression mode among the plurality of different compression modes, and each invoked processor uses the corresponding accelerator to compress or decompress the data stream, and
invoking, via the hardware accelerator, the selected compression mode based on the current workload of each hardware processor.

11. The method of claim 10, further comprising invoking a first compression mode among the plurality of compression modes such that at least one remaining processor among the plurality of processors is utilized to drive its corresponding accelerator and compress or decompress the data stream.

12. The method of claim 11, wherein the at least one remaining processor is located remotely from the first processor.

13. The method of claim 12, further comprising operating the remaining processors in parallel with one another to compress or decompress the data stream in response to invoking the first compression mode.

14. The method of claim 11, further comprising invoking a different second compression mode among the plurality of compression modes such that the accelerator utilizes the first processor while remaining processors among the plurality of processors are excluded from compressing or decompressing the data stream.

15. The method of claim 14, further comprising:
adding compression information indicating an expected compression ratio associated with the data compression request to the data compression request;
determining, via the hardware accelerator, the expected compression ratio prior to compressing or decompressing the data stream; and
automatically selecting, via the hardware accelerator, between the first compression mode and the second compression mode based on the expected compression ratio corresponding to the data compression request.

16. The method of claim 15, further comprising issuing, via the application, a compression mode request that requests a selected compression mode among the plurality of different compression modes.

17. The method of claim 16, further comprising:
overriding, via the accelerator, the compression mode request; and
invoking, via the accelerator, a second compression mode different from the compression mode indicated by the compression mode request in response to determining a presence of at least one override condition,
wherein the override condition includes at least one of a compression ratio corresponding to the data compression request, a number of the remaining processors available to perform the data compression request, and an overall latency requirement of the computer system.

18. A computer program product to control a computer system to perform compression or decompression of data stream, the computer program product comprising a non-transitory computer readable storage medium having program instructions embodied therewith, the program instructions executable by an electronic computer processor to control the computer system to perform operations comprising:
running an application via a first processor included among a plurality of hardware processors, each processor in signal communication with a corresponding accelerator;
issuing, via the application, a data compression request to compress or decompress a data stream;
monitoring, via the hardware accelerator, a current workload of each hardware processor among the plurality of processors; and
selectively operating the computer system in a plurality of different compression modes to compress or decompress the data stream,
wherein the computer system invokes a different number of processors among the plurality of hardware based on a selected compression mode among the plurality of different compression modes, and each invoked processor uses the corresponding accelerator to compress or decompress the data stream, and
invoking, via the hardware accelerator, the selected compression mode based on the current workload of each hardware processor.

19. The computer program product of claim 18, further comprising invoking a first compression mode among the plurality of compression modes such that at least one remaining processor among the plurality of processors is utilized to drive its corresponding accelerator and compress or decompress the data stream,
wherein the at least one remaining processor is located remotely from the first processor.

20. The computer program product of claim 19, further comprising invoking a different second compression mode among the plurality of compression modes such that the computer system utilizes the accelerator corresponding to the first processor while excluding remaining processors among the plurality of processors to compress or decompress the data stream,
wherein invoking the first and second compression modes further comprises:
adding compression information indicating an expected compression ratio associated with the data compression request to the data compression request;

determining, via the hardware accelerator, the expected compression ratio prior to compressing or decompressing the data stream; and automatically selecting, via the hardware accelerator, between the first compression mode and the second compression mode based on the expected compression ratio corresponding to the data compression request.

* * * * *